(12) United States Patent
Mukai et al.

(10) Patent No.: US 10,964,802 B2
(45) Date of Patent: Mar. 30, 2021

(54) SEMICONDUCTOR DEVICE AND METHOD FOR MANUFACTURING THE SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Akira Mukai, Kawasaki (JP); Yosuke Kajiwara, Yokohama (JP); Daimotsu Kato, Kawasaki (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

(*) Notice: Subject to any disclaimer, the term of this patent is extended or adjusted under 35 U.S.C. 154(b) by 0 days.

(21) Appl. No.: 16/298,172

(22) Filed: Mar. 11, 2019

(65) Prior Publication Data

US 2020/0027976 A1  Jan. 23, 2020

(30) Foreign Application Priority Data

Jul. 23, 2018 (JP) .............................. JP2018-137954

(51) Int. Cl.
*H01L 29/66* (2006.01)
*H01L 29/778* (2006.01)
(Continued)

(52) U.S. Cl.
CPC .......... *H01L 29/7783* (2013.01); *H01L 29/04* (2013.01); *H01L 29/207* (2013.01); *H01L 29/66462* (2013.01)

(58) Field of Classification Search
None
See application file for complete search history.

(56) References Cited

U.S. PATENT DOCUMENTS 8,222,675 B2  7/2012  Sugimoto et al.
8,674,407 B2  3/2014  Ando et al.
(Continued)

FOREIGN PATENT DOCUMENTS

JP  2007-227621  9/2007
JP  2008-140813  6/2008
(Continued)

OTHER PUBLICATIONS

Cheng Liu, et al., "Plasma-Enhanced Atomic Layer Deposition of AlN Epitaxial thin Film for AlN/GaN Heterostructure TFTs", IEEE Electron Device Letters, vol. 34, No. 9, 2013, 3 pages.
(Continued)

*Primary Examiner* — Joseph C Nicely
*Assistant Examiner* — Lamont B Koo
(74) *Attorney, Agent, or Firm* — Oblon, McClelland, Maier & Neustadt, L.L.P.

(57) ABSTRACT

According to one embodiment, a semiconductor device includes first to third electrodes, first to third layers, and a first insulating layer. The first layer includes first to fifth partial regions. The first partial region is between the fourth and third partial regions. The second partial region is between the third and fifth partial regions. The first insulating layer includes first and second inter-layer regions. The second layer includes first and second intermediate regions. The first intermediate region is provided between the first partial region and the first inter-layer region. The second intermediate region is provided between the second partial region and the second inter-layer region. The third layer includes first to third nitride regions. The first inter-layer (Continued)

region is between the first intermediate region and the first nitride region. The second inter-layer region is between the second intermediate region and the second nitride region.

20 Claims, 5 Drawing Sheets (51) Int. Cl.
H01L 29/207 (2006.01)
H01L 29/04 (2006.01)

(56) References Cited

U.S. PATENT DOCUMENTS

| | | | |
|---|---|---|---|
| 9,337,332 B2 | 5/2016 | Chu et al. | |
| 2003/0030056 A1* | 2/2003 | Callaway, Jr. | H01L 21/8258 257/76 |
| 2010/0123139 A1* | 5/2010 | Sato | H01L 29/155 257/76 |
| 2015/0076508 A1* | 3/2015 | Saito | H01L 29/4236 257/76 |
| 2016/0056274 A1* | 2/2016 | Kawaguchi | H01L 29/402 257/192 |
| 2016/0351698 A1 | 12/2016 | Yang | |
| 2017/0301765 A1* | 10/2017 | Tsuchiya | H01L 29/78 |

FOREIGN PATENT DOCUMENTS

| | | |
|---|---|---|
| JP | 4224737 | 2/2009 |
| JP | 2010-050280 | 3/2010 |
| JP | 2014-212340 | 11/2014 |
| JP | 2016-225594 | 12/2016 |

OTHER PUBLICATIONS

Ting-En Hsieh, et al., "Gate Recessed Quasi-Normally OFF $Al_2O_3$/AlGaN/GaN MIS-HEMT With Low Threshold Voltage Hysteresis Using PEALD AlN Interfacial Passivation Layer", IEEE Electron Device Letters, vol. 35, No. 7, 2014, 3 pages.

K J Voon, et al., "Polarization charge properties of low-temperature atomic layer deposition of AlN on GaN", Journal of Physics D: Applied Physics 47, 345104, 2014, 5 pages.

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2018-137954, filed on Jul. 23, 2018; the entire contents of which are incorporated herein by reference.

FIELD

Embodiments described herein relate generally to a semiconductor device and a method for manufacturing the same.

BACKGROUND

For example, there is a semiconductor device that uses a nitride semiconductor. It is desirable to improve the characteristics of the semiconductor device.

DETAILED DESCRIPTION

According to one embodiment, a semiconductor device includes first to third electrodes, first to third layers, and a first insulating layer. A direction from the first electrode toward the second electrode is aligned with a first direction. A position in the first direction of the third electrode is between a position in the first direction of the first electrode and a position in the first direction of the second electrode. The first layer includes $Al_{x1}Ga_{1-x1}N$ ($0 \le x1 < 1$). The first layer includes first to fifth partial regions. A direction from the fourth partial region toward the first electrode is aligned with a second direction crossing the first direction. A direction from the fifth partial region toward the second electrode is aligned with the second direction. A direction from the third partial region toward the third electrode is aligned with the second direction. The first partial region is between the fourth partial region and the third partial region in the first direction. The second partial region is between the third partial region and the fifth partial region in the first direction. The first insulating layer includes a first inter-layer region and a second inter-layer region. A direction from the first partial region toward the first inter-layer region is aligned with the second direction. A direction from the second partial region toward the second inter-layer region is aligned with the second direction. The second layer includes $Al_{x2}Ga_{1-x2}N$ ($0 < x1 < x2 \le 1$). The second layer includes a first intermediate region and a second intermediate region. The first intermediate region is provided between the first partial region and the first inter-layer region in the second direction. The second intermediate region is provided between the second partial region and the second inter-layer region in the second direction. The third layer includes $Al_{x3}Ga_{1-x3}N$ ($0 < x1 < x3 \le 1$). The third layer includes first to third nitride regions. The first inter-layer region is between the first intermediate region and the first nitride region in the second direction. The second inter-layer region is between the second intermediate region and the second nitride region in the second direction. The third nitride region is between the third partial region and the third electrode in the second direction. A crystallinity of the third nitride region is higher than a crystallinity of the first nitride region and higher than a crystallinity of the second nitride region. According to another embodiment, a method for manufacturing a semiconductor device is disclosed. The method can include removing a portion of a first insulating layer and a portion of a second layer to expose a portion of a first layer of a stacked body. The stacked body includes the first layer, the second layer, and the first insulating layer. The first layer includes $Al_{x1}Ga_{1-x1}N$ ($0 \le x1 < 1$). The second layer includes $Al_{x2}Ga_{1-x2}N$ ($0 < x1 < x2 \le 1$) and is provided on the first layer. The first insulating layer is provided on the second layer. The method can include forming a third layer at the portion of the first layer, at a remaining portion of the second layer, and at a remaining portion of the first insulating layer. The third layer includes $Al_{x3}Ga_{1-x3}N$ ($0 < x1 < x3 \le 1$). The third layer includes a region on the portion of the first layer and a region on the remaining portion of the first insulating layer. A crystallinity of the region on the portion of the first layer is higher than a crystallinity of the region on the remaining portion of the first insulating layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
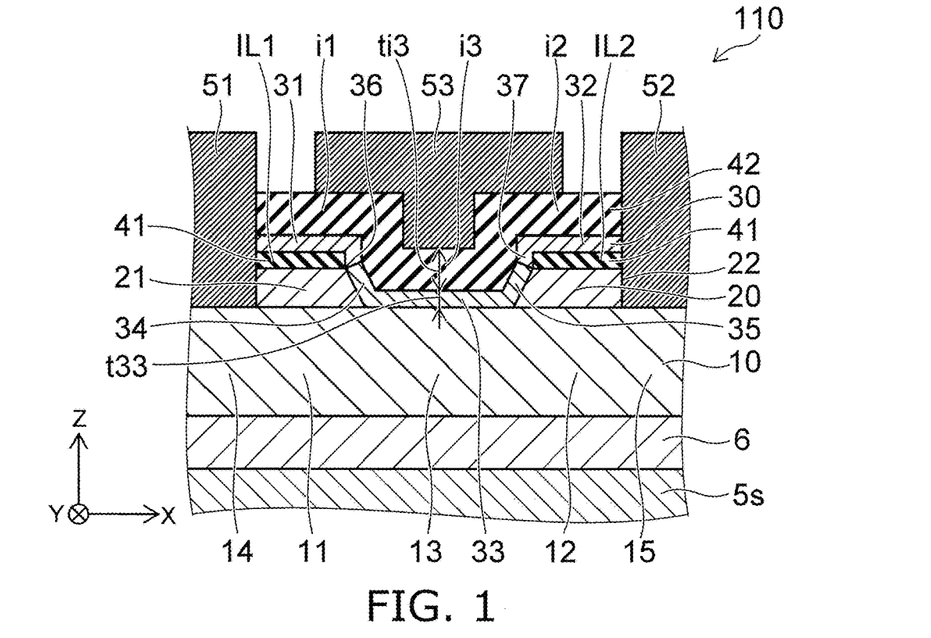
FIG. 1 is a schematic cross-sectional view illustrating a semiconductor device according to a first embodiment.

FIG. 1 is a schematic cross-sectional view illustrating a semiconductor device according to a first embodiment.

As shown in FIG. 1, the semiconductor device 110 according to the embodiment includes first to third electrodes 51 to 53, a first layer 10, a second layer 20, a third layer 30, and a first insulating layer 41. A second insulating layer 42 is further provided in the example.

The direction from the first electrode 51 toward the second electrode 52 is aligned with a first direction. The first direction is taken as an X-axis direction. A direction perpendicular to the X-axis direction is taken as a Z-axis direction. A direction perpendicular to the X-axis direction and the Z-axis direction is taken as a Y-axis direction.

The position in the first direction (the X-axis direction) of the third electrode 53 is between the position in the first direction of the first electrode 51 and the position in the first direction of the second electrode 52.

The first layer 10 includes $Al_{x1}Ga_{1-x1}N$ (0≤x1<1). In one example, the composition ratio x1 is not less than 0 and not more than 0.1. For example, the first layer 10 is a GaN layer.

The first layer 10 includes first to fifth partial regions 11 to 15. The direction from the fourth partial region 14 toward the first electrode 51 is aligned with a second direction. The second direction crosses the first direction. The second direction is, for example, the Z-axis direction. The direction from the fifth partial region 15 toward the second electrode 52 is aligned with the second direction (e.g., the Z-axis direction). The direction from the third partial region 13 toward the third electrode 53 is aligned with the second direction. The first partial region 11 is between the fourth partial region 14 and the third partial region 13 in the first direction (the X-axis direction). The second partial region 12 is between the third partial region 13 and the fifth partial region 15 in the first direction.

The first insulating layer 41 includes a first inter-layer region IL1 and a second inter-layer region IL2. The direction from the first partial region 11 toward the first inter-layer region IL1 is aligned with the second direction (e.g., the Z-axis direction). The direction from the second partial region 12 toward the second inter-layer region IL2 is aligned with the second direction.

The second layer 20 includes $Al_{x2}Ga_{1-x2}N$ (0<x1<x2≤1). In one example, the composition ratio x2 is not less than 0.3 and not more than 0.95. The composition ratio x2 may be not less than 0.15 and not more than 0.95. For example, the second layer 20 is an AlGaN layer.

The second layer 20 includes a first intermediate region 21 and a second intermediate region 22. The first intermediate region 21 is provided between the first partial region 11 and the first inter-layer region IL1 in the second direction (e.g., the Z-axis direction). The second intermediate region 22 is provided between the second partial region 12 and the second inter-layer region IL2 in the second direction.

The third layer 30 includes $Al_{x3}Ga_{1-x3}N$ (0<x1<x3≤1). In one example, the composition ratio x3 is not less than 0.8 and not more than 1. For example, the third layer 30 is an AlN layer.

The third layer 30 includes first to third nitride regions 31 to 33. The first inter-layer region IL1 is between the first intermediate region 21 and the first nitride region 31 in the second direction (e.g., the Z-axis direction). The second inter-layer region IL2 is between the second intermediate region 22 and the second nitride region 32 in the second direction. The third nitride region 33 is between the third partial region 13 and the third electrode 53 in the second direction.

At least a portion of the third nitride region 33 is between the first intermediate region 21 and the second intermediate region 22 in the first direction (the X-axis direction).

A portion of the third nitride region 33 may be between the first partial region 11 and the second partial region 12 in the first direction (the X-axis direction). For example, the portion of the third nitride region 33 may be filled into a region where a portion of the first layer 10 is removed.

The second insulating layer 42 includes first to third insulating regions i1 to i3. The first nitride region 31 is between the first inter-layer region IL1 and the first insulating region i1 in the second direction (e.g., the Z-axis direction). The second nitride region 32 is between the second inter-layer region IL2 and the second insulating region i2 in the second direction. The third insulating region i3 is between the third nitride region 33 and the third electrode 53 in the second direction.

In the example, a portion of the first inter-layer region ILL a portion of the first nitride region 31, and a portion of the first insulating region i1 are provided between the first intermediate region 21 and a portion of the third electrode 53 in the second direction (e.g., the Z-axis direction). A portion of the second inter-layer region IL2, a portion of the second nitride region 32, and a portion of the second insulating region i2 are provided between the second intermediate region 22 and another portion of the third electrode 53 in the second direction (e.g., the Z-axis direction).

In the example, at least a portion of the third insulating region i3 is provided between the first inter-layer region IL1 and the second inter-layer region IL2 in the first direction (e.g., the X-axis direction).

In the example, the third layer 30 further includes a fourth nitride region 34 and a fifth nitride region 35. The fourth nitride region 34 is provided between the first intermediate region 21 and the third insulating region i3 in the first direction (the X-axis direction). The fifth nitride region 35 is provided between the second intermediate region 22 and the third insulating region i3 in the first direction. For example, the third layer 30 is provided between the third insulating region i3 and the side surface of the second layer 20.

In the example, the third layer 30 further includes a sixth nitride region 36 and a seventh nitride region 37. The sixth nitride region 36 is provided between the first inter-layer region IL1 and the third insulating region i3 in the first direction (the X-axis direction). The seventh nitride region 37 is provided between the second inter-layer region IL2 and the third insulating region i3 in the first direction.

For example, the fourth nitride region 34, the third nitride region 33, and the fifth nitride region 35 are continuous with each other. For example, the first nitride region 31 and the sixth nitride region 36 are continuous with each other. For example, the second nitride region 32 and the seventh nitride region 37 are continuous with each other.

The thickness along the second direction (e.g., the Z-axis direction) of the third nitride region 33 of the third layer 30 is taken as a thickness t33. The thickness t33 is, for example, not less than 0.5 nm and not more than 10 nm. The thickness along the second direction (e.g., the Z-axis direction) of the third insulating region i3 of the second insulating layer 42 is taken as a thickness ti3. The thickness ti3 is, for example, not less than 10 nm and not more than 100 nm. Examples of these thicknesses are described below.

A substrate 5s and a buffer layer 6 are further provided in the example. The substrate 5s is, for example, a silicon substrate. The substrate 5s may be, for example, a sapphire substrate. The buffer layer 6 includes, for example, a nitride semiconductor. The buffer layer 6 may include a stacked member including multiple films having mutually-different corn positions.

The buffer layer 6 is provided on the substrate 5s. For example, the first layer 10 and the second layer 20 are provided in this order on the buffer layer 6. For example, the first insulating layer 41 is provided on the second layer 20. For example, the third layer 30 is provided on the first insulating layer 41 and the third partial region 13 of the first layer 10. For example, the second insulating layer 42 is provided on the third layer 30. The third electrode 53 is provided on the second insulating layer 42. In the example, the first electrode 51 is provided on the fourth partial region 14 of the first layer 10. The second electrode 52 is provided on the fifth partial region 15 of the first layer 10. For example, the first electrode 51 is electrically connected to the fourth partial region 14. For example, the second electrode 52 is electrically connected to the fifth partial region 15.

For example, a two-dimensional electron gas (2DEG) is generated in the first partial region 11 at the vicinity of the first intermediate region 21. For example, a two-dimensional electron gas (2DEG) is generated in the second partial region 12 at the vicinity of the second intermediate region 22.

For example, the first electrode 51 functions as a source electrode. For example, the second electrode 52 functions as a drain electrode. For example, the third electrode 53 functions as a gate electrode. The third nitride region 33 of the third layer 30 functions as a portion of a gate insulating film. The third insulating region i3 of the second insulating layer 42 functions as another portion of the gate insulating film. The semiconductor device 110 is, for example, a HEMT (high-electron mobility transistor).

The threshold of the semiconductor device 110 is relatively high. The semiconductor device 110 performs a normally-off operation.

In the embodiment, the crystallinity of the third nitride region 33 is higher than the crystallinity of the first nitride region 31 and higher than the crystallinity of the second nitride region 32. By setting the crystallinity of the third nitride region 33 to be high, high mobility is obtained easily in the on-state.

On the other hand, the operation is stabilized easily by setting the crystallinity of the first nitride region 31 and the crystallinity of the second nitride region 32 to be low. For example, the breakdown voltage increases. For example, current collapse can be suppressed. For example, traps do not occur easily in the first nitride region 31 and the second nitride region 32. High electrical insulation properties are easier to obtain in the first nitride region 31 and the second nitride region 32.

For example, at least one of the first nitride region 31 or the second nitride region 32 includes an amorphous portion. The entire first nitride region 31 and the entire second nitride region 32 may be amorphous. It is more desirable for at least one of the first nitride region 31 or the second nitride region 32 to be amorphous. In the case where at least one of the first nitride region 31 or the second nitride region 32 is amorphous, for example, defect densities are low; therefore, for example, the occurrence of the current collapse can be suppressed.

On the other hand, the third nitride region 33 includes a crystalline portion. The entire third nitride region 33 may be a crystal. The c-axis of the crystalline portion recited above is aligned with the second direction (e.g., the Z-axis direction).

It is considered that because the third nitride region 33 includes the crystalline portion, for example, movable carriers are generated in the third partial region 13 at the vicinity of the third nitride region 33 when a voltage is applied to the first electrode 51 (the on-state). The carriers may be, for example, a 2DEG. It is considered that a high mobility is obtained by the carriers. In the case where the crystallinity of the third nitride region 33 is high, for example, carrier scattering due to charged defects generated inside the AlN can be suppressed. In the case where the crystallinity of the third nitride region 33 is high, the two-dimensional electron gas is formed at, for example, the interface. The mobility can be improved.

According to the embodiment, for example, a high mobility is obtained. For example, a semiconductor device in which the characteristics can be improved is obtained. For example, a high breakdown voltage is obtained. For example, the current collapse can be suppressed.

For example, information relating to the crystallinity (the crystalline state) is obtained using a transmission electron microscope (TEM), or X-ray diffraction, etc.

Figure 2:
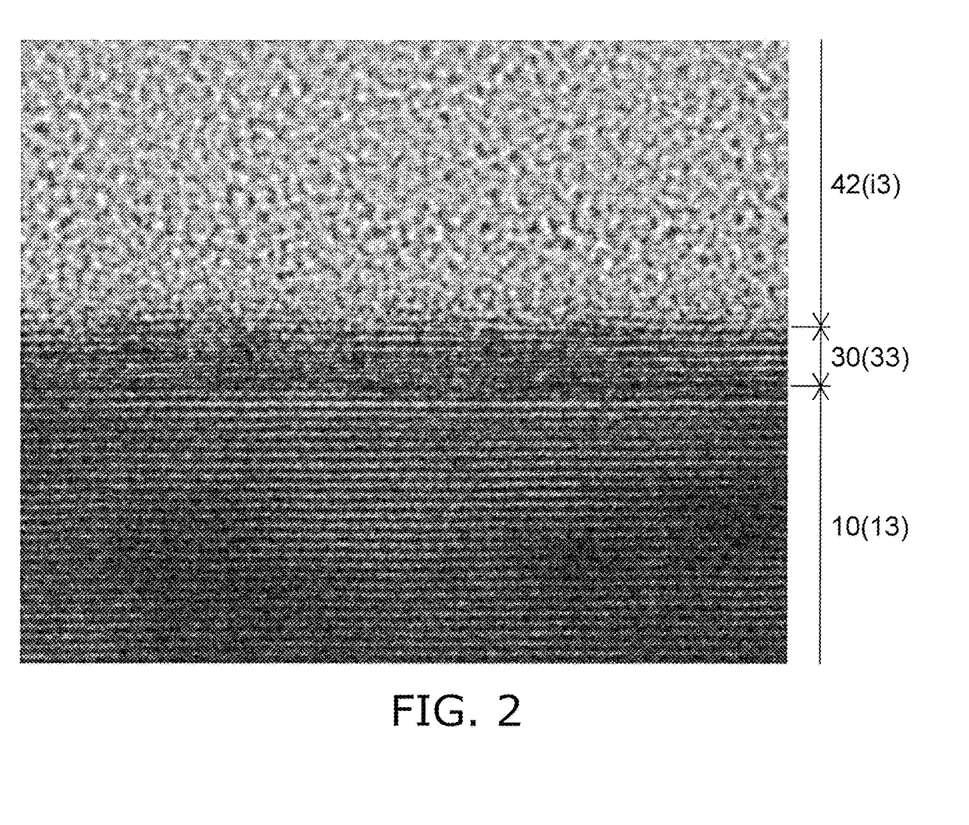
FIG. 2 is a schematic cross-sectional view illustrating the semiconductor device according to the first embodiment.

FIG. 2 is a schematic cross-sectional view illustrating the semiconductor device according to the first embodiment.

FIG. 2 is a cross-section TEM (Transmission Electron Microscope) image of a region including the first layer 10 (the third partial region 13), the third layer 30 (the third nitride region 33), and the second insulating layer 42 (the third insulating region i3). As shown in FIG. 2, it can be seen that the third partial region 13 and the third nitride region 33 are crystals. On the other hand, the third insulating region i3 (in the example, $SiO_2$) is amorphous. The crystal lattice of the third nitride region 33 inherits the crystal lattice of the third partial region 13. For example, the third nitride region 33 is epitaxially grown on the third partial region 13.

In the embodiment, the crystallinity of the fourth nitride region 34 (the side surface portion) may be higher than the crystallinity of the first nitride region 31 and higher than the crystallinity of the second nitride region 32. The crystallinity of the fifth nitride region 35 (the side surface portion) may be higher than the crystallinity of the first nitride region 31 and higher than the crystallinity of the second nitride region 32.

For example, the first insulating layer 41 includes silicon and nitrogen. The first insulating layer 41 is, for example, a SiN film.

In the first insulating layer 41, at least one of the first inter-layer region IL1 or the second inter-layer region IL2 includes an amorphous portion. The crystallinity of the first nitride region 31 and the second nitride region 32 decreases easily thereby. For example, the first nitride region 31 and the second nitride region 32 easily become amorphous.

The second insulating layer 42 includes, for example, silicon. The second insulating layer 42 includes at least one selected from the group consisting of oxygen and nitrogen. The second insulating layer 42 may include, for example, at least one selected from the group consisting of silicon oxide, silicon nitride, and silicon oxynitride. High insulation properties are obtained.

In the case where the second insulating layer 42 includes silicon, the third nitride region 33 may include silicon. For example, a portion of the silicon included in the second insulating layer 42 may move (diffuse) into the third nitride region 33. Thereby, the electrical characteristics of the third nitride region 33 are controlled; and carriers are generated easily in the third partial region 13 at the vicinity of the third nitride region 33 in the on-state. A high mobility is obtained easily.

An example of a method for manufacturing the semiconductor device 110 will now be described.

Figure 3A:
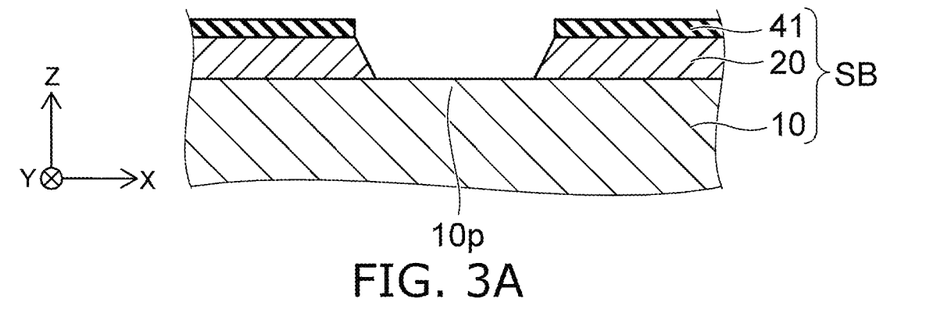
FIG. 3A to FIG. 3C are schematic cross-sectional views in order of the processes, illustrating a method for manufacturing the semiconductor device according to the first embodiment.
Figure 3B:
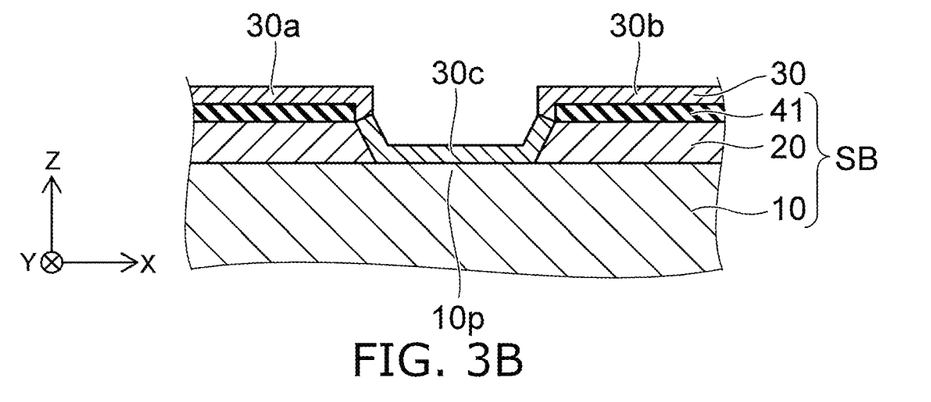
Figure 3C:
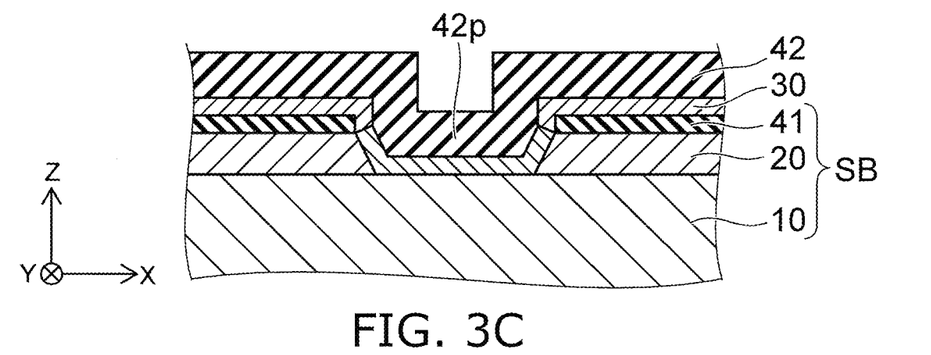

FIG. 3A to FIG. 3C are schematic cross-sectional views in order of the processes, illustrating the method for manufacturing the semiconductor device according to the first embodiment.

A stacked body SB is provided as shown in FIG. 3A. The stacked body SB includes the first layer 10 including $Al_{x1}Ga_{1-x1}N$ (0≤x1<1), the second layer 20 including $Al_{x2}Ga_{1-x2}N$ (0<x1<x2≤1), and the first insulating layer 41. The second layer 20 is provided on the first layer 10. The first insulating layer 41 is provided on the second layer 20. A portion 10p of the first layer 10 is exposed by removing a portion of the first insulating layer 41 and a portion of the second layer 20 of the stacked body SB. For example, RIE or the like is performed. The first insulating layer 41 is, for example, amorphous.

As shown in FIG. 3B, the third layer 30 that includes $Al_{x3}Ga_{1-x3}N$ (0<x1<x3≤1) is formed. The third layer 30 is formed at the portion 10p of the first layer 10, the remaining portion of the second layer 20, and the remaining portion of the first insulating layer 41.

The formation of the third layer 30 includes forming the third layer 30 at a temperature not less than 300° C. and not more than 500° C. In another example, the formation of the third layer 30 includes forming the third layer 30 at a temperature not less than 300° C. and not more than 600° C. For example, the third layer 30 is formed by CVD (chemical vapor deposition) at about 400° C. The CVD is, for example, ALD (Atomic Layer Deposition).

The third layer 30 is formed at a relatively low temperature. A region 30c inside the third layer 30 on the portion 10p of the first layer 10 inherits the crystallinity of the portion 10p of the first layer 10. On the other hand, regions 30a and 30b on the remaining portion of the first insulating layer 41 easily become amorphous due to effects of the first insulating layer 41 which is the foundation.

Thus, the third layer 30 includes the region 30c on the portion 10p of the first layer 10, and the regions 30a and 30b on the remaining portion of the first insulating layer 41. The crystallinity of the region 30c on the portion 10p of the first layer 10 is higher than the crystallinity of the regions 30a and 30b on the remaining portion of the first insulating layer 41.

Thus, in the manufacturing method, by forming the third layer 30 at a relatively low temperature, a difference can be formed between the crystallinities of the multiple regions 30a to 30c of the third layer 30. For example, a semiconductor device in which the characteristics can be improved can be manufactured with high productivity.

Subsequently, as shown in FIG. 3C, the second insulating layer 42 also may be formed. The second insulating layer 42 is formed on the region 30c on the portion 10p of the first layer 10 and the regions 30a and 30b on the remaining portion of the first insulating layer 41. The second insulating layer 42 includes a region 42p on the region 30c on the portion 10p of the first layer 10. For example, the region 42p corresponds to the third insulating region i3 (referring to FIG. 1).

Subsequently, an electrode (e.g., the third electrode 53) is formed at the region 42p recited above on the region 30c on the portion 10p of the first layer 10. The first electrode 51 and the second electrode 52 also may be formed.

An example of an operation of the semiconductor device 110 will now be described.

FIG. 4A to FIG. 4D are schematic views illustrating characteristics of the semiconductor device.

Figure 4A:
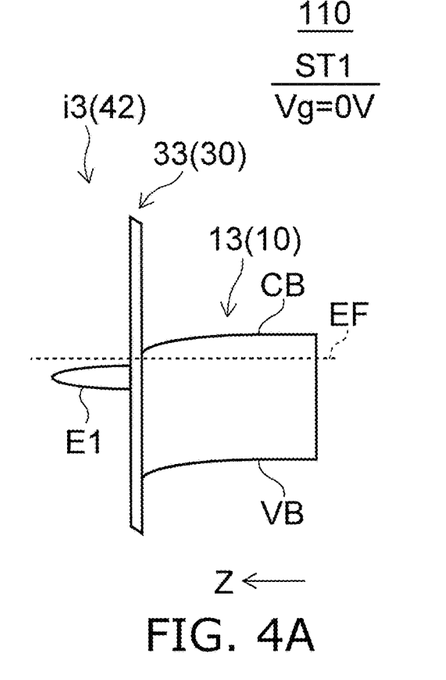
FIG. 4A to FIG. 4D are schematic views illustrating characteristics of the semiconductor device.
Figure 4B:
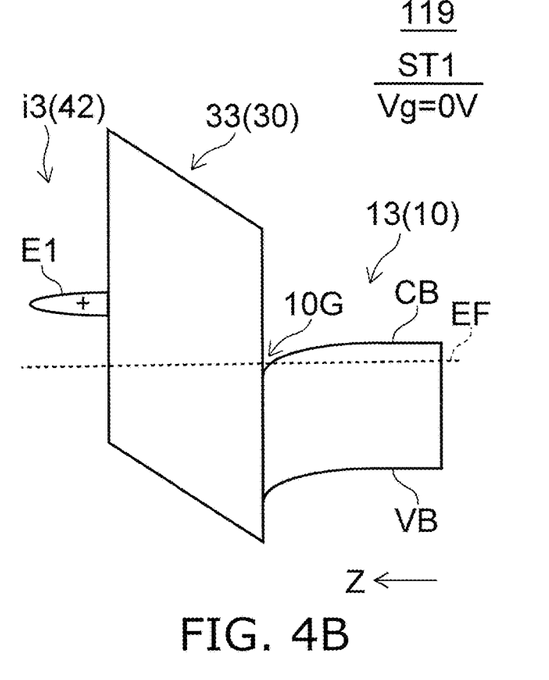
Figure 4C:
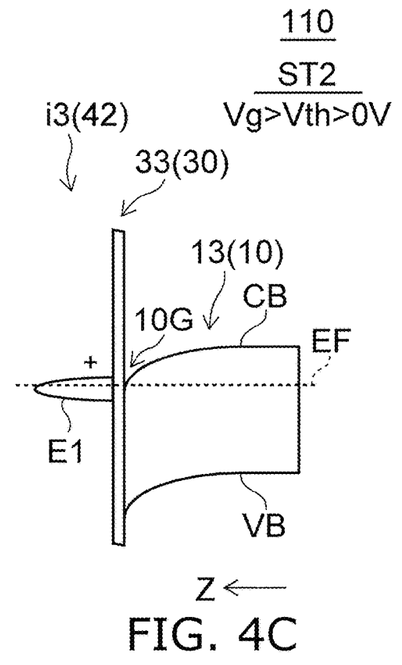
Figure 4D:
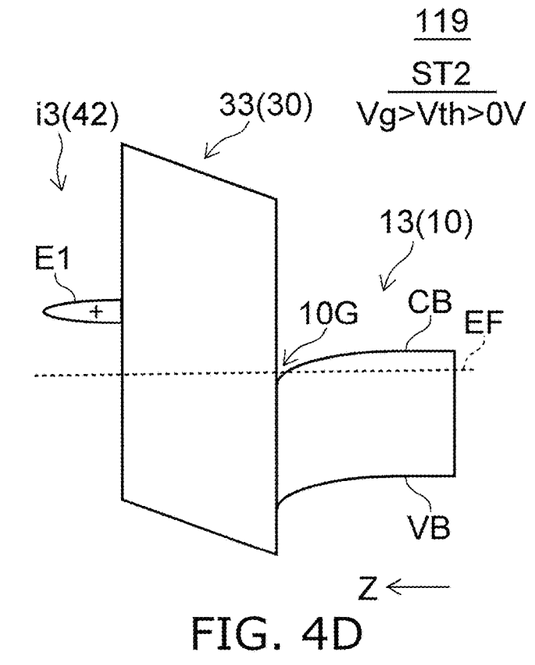

FIG. 4A and FIG. 4C correspond to the semiconductor device 110. In the semiconductor device 110, the thickness t33 of the third nitride region 33 of the third layer 30 is thin. FIG. 4B and FIG. 4D correspond to a semiconductor device 119. In the semiconductor device 119, the thickness t33 of the third nitride region 33 of the third layer 30 is thicker than the thickness t33 of the semiconductor device 110. FIG. 4A and FIG. 4B correspond to a first state ST1. In the first state ST1, a gate voltage Vg is 0 volts (V). The first state ST1 corresponds to the off-state. FIG. 4C and FIG. 4D correspond to a second state ST2. In the second state ST2, the gate voltage Vg is greater than 0 V and greater than a threshold voltage Vth. The second state ST2 corresponds to the on-state. These drawings schematically show the states of the energy bands in the region including the third partial region 13, the third nitride region 33, and the third insulating region i3. These drawings illustrate a conduction band CB, a valence band VB, and a Fermi level EF.

In the semiconductor device 119 as shown in FIG. 4B, a two-dimensional electron gas 10G (2DEG) is generated in the first state ST1 (the off-state). Therefore, the threshold voltage is low; and the semiconductor device 119 is normally-on. On the other hand, in the semiconductor device 110 as shown in FIG. 4A, the two-dimensional electron gas 10G is not generated in the first state ST1 (the off-state). Therefore, the threshold voltage is high; and the semiconductor device 110 is normally-off.

In the semiconductor device 119 as shown in FIG. 4D, the band state in the second state ST2 (the on-state) is substantially similar to the band state in the first state ST1.

On the other hand, in the semiconductor device 110 as shown in FIG. 4C, carriers (e.g., the two-dimensional electron gas 10G) are generated in the second state ST2 (the on-state). For example, in the second state ST2, the conduction band CB of the third partial region 13 (e.g., GaN) increases; and the conduction band CB of the third partial region 13 has a larger gradient compared to the first state ST1. On the other hand, a donor interface state μI that exists in the third insulating region i3 overcomes the Fermi level EF. Thereby, the carriers of the interface state μI overcome the third nitride region 33 and move into the third partial region 13. It is considered that movable carriers are generated in the third partial region 13 thereby.

An example of the operation of the semiconductor device 110 will now be described. An example of evaluation results of the characteristics when the thickness t33 of the third nitride region 33 of the third layer 30 is changed will now be described. In the experiment, the first layer 10 is GaN. The second layer 20 is AlGaN (having an Al composition ratio of 0.25). The thickness of the second layer 20 is 30 nm. The third layer 30 is AlN. The first insulating layer 41 is SiN. The thickness of the first insulating layer 41 is 10 nm. The second insulating layer 42 is $SiO_2$. The thickness (the thickness ti3) of the second insulating layer 42 is 30. The first insulating layer 41 and the second insulating layer 42 are amorphous. In the experiment, multiple samples in which the thickness t33 is 0 nm to 4.2 nm are made. The third layer 30 is not provided in the sample in which the thickness t33 is 0 nm. The mobility and the threshold voltage are evaluated for these samples.

Figure 5:
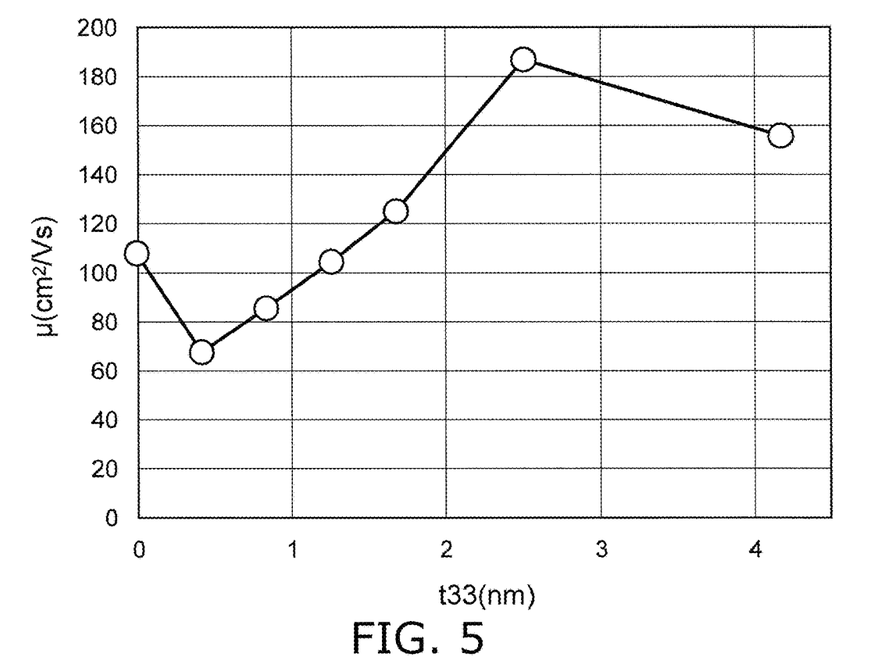
FIG. 5 is a graph illustrating a characteristic of the semiconductor device according to the first embodiment.

FIG. 5 is a graph illustrating a characteristic of the semiconductor device according to the first embodiment.

The horizontal axis of FIG. 5 corresponds to the thickness t33 (nm). The vertical axis corresponds to a mobility μ ($cm^2/Vs$). It can be seen from FIG. 5 that the mobility μ increases as the thickness t33 increases in the range where the thickness t33 is not less than 0.4 nm and not more than 2.5 nm. It is considered that this phenomenon relates to the carriers generated in the third partial region 13 at the vicinity of the third nitride region 33 in the on-state in the range where the thickness t33 is 0.4 nm or more.

Figure 6:
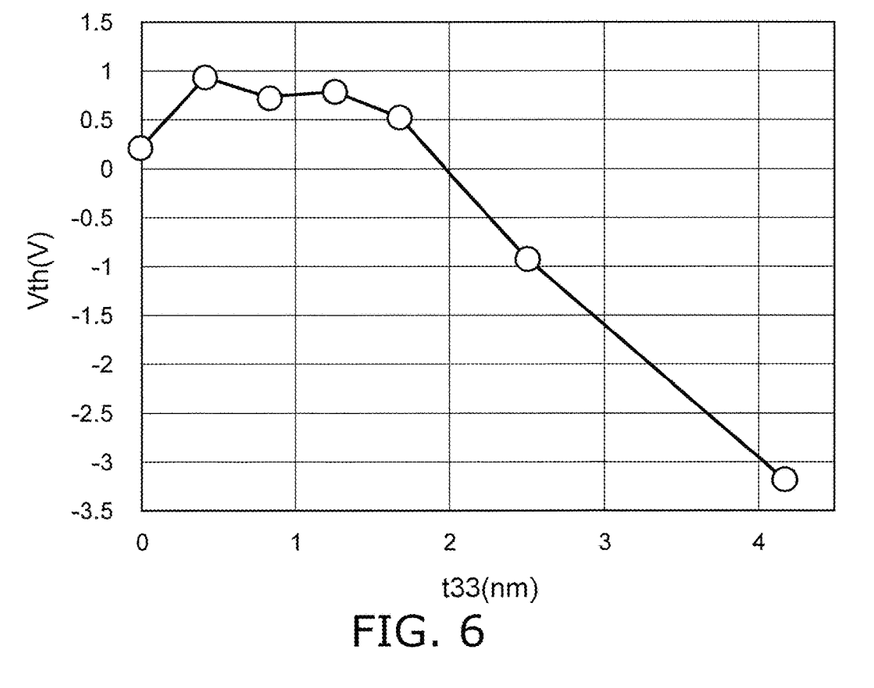
FIG. 6 is a graph illustrating a characteristic of the semiconductor device according to the first embodiment.

FIG. 6 is a graph illustrating a characteristic of the semiconductor device according to the first embodiment.

The horizontal axis of FIG. 6 corresponds to the thickness t33 (nm). The vertical axis corresponds to the threshold voltage Vth (V). It can be seen from FIG. 6 that when the thickness t33 exceeds 1.7 nm, the threshold voltage Vth decreases as the thickness t33 increases. When the thickness t33 exceeds 2.5 nm, the threshold voltage Vth is negative; and the absolute value of the threshold voltage Vth becomes large. When the thickness t33 is excessively thick, the carriers increase excessively; and the threshold voltage Vth decreases. When the threshold voltage Vth decreases excessively, a normally-off operation is difficult to obtain.

From the results recited above, it is favorable for the thickness t33 (the thickness along the second direction (the Z-axis direction) of the third nitride region 33) to be not less than 0.8 nm and not more than 4.2 nm. It is more favorable for the thickness t33 to be not less than 1.7 nm and not more than 2.5 nm.

On the other hand, in the embodiment, it is favorable for the thickness ti3 (the thickness along the second direction (the Z-axis direction) of the third insulating region i3) to be not less than 20 nm and not more than 60 nm. Good insulative properties and a practical threshold voltage Vth are obtained thereby. The thickness ti3 may be not less than 20 nm and not more than 30 nm.

In the embodiment, at least one of the first electrode 51 or the second electrode 52 includes, for example, an alloy including Al. The third electrode 53 includes, for example, TiN.

Second Embodiment

The embodiment relates to a method for manufacturing a semiconductor device. For example, the manufacturing method includes the processing described in reference to FIG. 3A to FIG. 3C.

Figure 7:
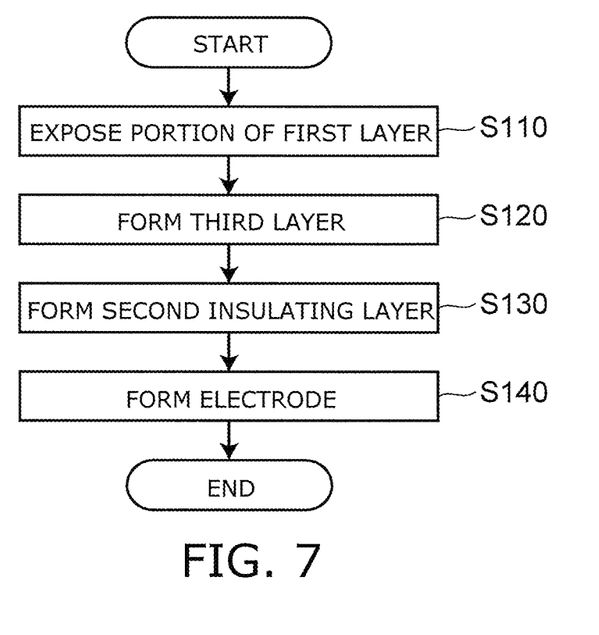
FIG. 7 is a flowchart illustrating a method for manufacturing a semiconductor device according to a second embodiment.

FIG. 7 is a flowchart illustrating the method for manufacturing the semiconductor device according to the second embodiment.

As shown in FIG. 7, the portion 10p of the first layer 10 is exposed by removing a portion of the first insulating layer 41 and a portion of the second layer 20 of the stacked body SB (step S110). For example, the processing described in reference to FIG. 3A is performed.

The third layer 30 is formed (step S120). For example, the processing described in reference to FIG. 3B is performed. The crystallinity of the region 30c on the portion 10p of the first layer 10 is higher than the crystallinity of the regions 30a and 30b on the remaining portion of the first insulating layer 41.

The second insulating layer 42 is formed (step S130). For example, the processing described in reference to FIG. 3C is performed. An electrode also is formed (step S140).

According to the embodiment, a semiconductor device and a method for manufacturing the semiconductor device can be provided in which the characteristics can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, layers, insulating layers, substrates, buffer layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode, a direction from the first electrode toward the second electrode being aligned with a first direction;
   a third electrode, a position in the first direction of the third electrode being between a position in the first direction of the first electrode and a position in the first direction of the second electrode;
   a first layer including $Al_{x1}Ga_{1-x1}N$ ($0 \leq x1 < 1$), the first layer including first to fifth partial regions, a direction from the fourth partial region toward the first electrode being aligned with a second direction crossing the first direction, a direction from the fifth partial region toward the second electrode being aligned with the second direction, a direction from the third partial region toward the third electrode being aligned with the second direction, the first partial region being between the fourth partial region and the third partial region in the first direction, the second partial region being between the third partial region and the fifth partial region in the first direction;
   a first insulating layer including a first inter-layer region and a second inter-layer region, a direction from the first partial region toward the first inter-layer region being aligned with the second direction, a direction from the second partial region toward the second inter-layer region being aligned with the second direction;
   a second layer including $Al_{x2}Ga_{1-x2}N$ ($0 < x1 < x2 \leq 1$), the second layer including a first intermediate region and a second intermediate region, the first intermediate region being provided between the first partial region and the first inter-layer region in the second direction, the second intermediate region being provided between the second partial region and the second inter-layer region in the second direction; and
   a third layer including $Al_{x3}Ga_{1-x3}N$ ($0 < x1 < x3 \leq 1$), the third layer including first to third nitride regions, the first inter-layer region being between the first intermediate region and the first nitride region in the second direction, the second inter-layer region being between the second intermediate region and the second nitride region in the second direction, the third nitride region being between the third partial region and the third electrode in the second direction, a crystallinity of the third nitride region being higher than a crystallinity of the first nitride region and higher than a crystallinity of the second nitride region.

2. The device according to claim 1, further comprising a second insulating layer,
the second insulating layer including first to third insulating regions,
the first nitride region being between the first inter-layer region and the first insulating region in the second direction,
the second nitride region being between the second inter-layer region and the second insulating region in the second direction, and
the third insulating region being between the third nitride region and the third electrode in the second direction.

3. The device according to claim 2, wherein at least a portion of the third insulating region is provided between the first inter-layer region and the second inter-layer region in the first direction.

4. The device according to claim 3, wherein
the third layer further includes a fourth nitride region and a fifth nitride region,
the fourth nitride region is provided between the first intermediate region and the third insulating region in the first direction, and
the fifth nitride region is provided between the second intermediate region and the third insulating region in the first direction.

5. The device according to claim 4, wherein
a crystallinity of the fourth nitride region is higher than the crystallinity of the first nitride region and higher than the crystallinity of the second nitride region, and
a crystallinity of the fifth nitride region is higher than the crystallinity of the first nitride region and higher than the crystallinity of the second nitride region.

6. The device according to claim 3, wherein
the third layer further includes a sixth nitride region and a seventh nitride region,
the sixth nitride region is provided between the first inter-layer region and the third insulating region in the first direction, and
the seventh nitride region is provided between the second inter-layer region and the third insulating region in the first direction.

7. The device according to claim 2, wherein the second insulating layer includes silicon.

8. The device according to claim 7, wherein the second insulating layer includes at least one selected from the group consisting of oxygen and nitrogen.

9. The semiconductor device according to claim 7, wherein the third nitride region includes silicon.

10. The device according to claim 2, wherein a thickness along the second direction of the third insulating region is not less than 20 nm and not more than 60 nm.

11. The device according to claim 1, wherein at least one of the first inter-layer region or the second inter-layer region includes an amorphous portion.

12. The device according to claim 1, wherein at least one of the first nitride region and the second nitride region includes an amorphous portion.

13. The device according to claim 1, wherein the third nitride region includes a crystalline portion.

14. The device according to claim 13, wherein a c-axis of the crystalline portion is aligned with the second direction.

15. The device according to claim 1, wherein a thickness along the second direction of the third nitride region is not less than 0.8 nm and not more than 4.2 nm.

16. The device according to claim 1, wherein a thickness along the second direction of the third nitride region is not less than 1.7 nm and not more than 2.5 nm.

17. The device according to claim 1, wherein the semiconductor device performs a normally-off operation.

18. A method for manufacturing a semiconductor device, comprising:
removing a portion of a first insulating layer and a portion of a second layer to expose a portion of a first layer of a stacked body, the stacked body including the first layer, the second layer, and the first insulating layer, the first layer including $Al_{x1}Ga_{1-x1}N$ ($0 \leq x1 < 1$), the second layer including $Al_{x2}Ga_{1-x2}N$ ($0 < x1 < x2 \leq 1$) and being provided on the first layer, the first insulating layer being provided on the second layer; and
forming a third layer at the portion of the first layer, at a remaining portion of the second layer, and at a remaining portion of the first insulating layer, the third layer including $Al_{x3}Ga_{1-x3}N$ ($0 < x1 < x3 \leq 1$), the third layer including a region on the portion of the first layer and a region on the remaining portion of the first insulating layer, a crystallinity of the region on the portion of the first layer being higher than a crystallinity of the region on the remaining portion of the first insulating layer.

19. The method according to claim 18, wherein the forming of the third layer includes forming the third layer at a temperature not less than 300° C. and not more than 600° C.

20. The method according to claim 18, further comprising:
forming a second insulating layer on the region on the portion of the first layer and the region on the remaining portion of the first insulating layer, the second insulating layer including a region on the region on the portion of the first layer; and
forming an electrode at the region on the region on the portion of the first layer.

* * * * *